United States Patent [19]

Jennings, III et al.

[11] Patent Number: 5,394,030

[45] Date of Patent: Feb. 28, 1995

[54] PROGRAMMABLE LOGIC DEVICE

[75] Inventors: Earle W. Jennings, III, Richardson, Tex.; George H. Landers, Mountain View, Calif.

[73] Assignee: Infinite Technology Corporation, Richardson, Tex.

[21] Appl. No.: 972,993

[22] Filed: Nov. 10, 1992

[51] Int. Cl.[6] .......................................... H03K 19/177
[52] U.S. Cl. ...................................... 326/41; 364/489;
340/825.83; 326/39
[58] Field of Search .................. 307/465, 465.1, 482.1;
364/716, 488, 489; 340/825.83, 825.87

[56] References Cited

U.S. PATENT DOCUMENTS

| | | | |
|---|---|---|---|
| 4,124,899 | 11/1978 | Birkner et al. | 364/716 |
| 4,642,487 | 2/1987 | Carter | 307/465.1 |
| 4,847,612 | 7/1989 | Kaplinsky | 307/465 |
| 4,872,137 | 5/1989 | Agrawal . | |
| 5,136,188 | 8/1992 | Ha et al. | 307/465 |

OTHER PUBLICATIONS

Carver Mead, et al, Section 5.5 "The Arithmetic Logic Unit," *Introduction to VLSI Systems*, 1980, pp. 150-154.
Roy A. Wood, "A High Density Programmable Logic Array Chip," *IEEE Transactions on Computers*, vol. C-28, No. 9, Sep. 1979, pp. 602-608.
Steve Landry, "Application-specific ICs, relying on RAM, implement almost any logic function," *Electronic Design*, Oct. 31, 1985, pp. 123-130.

*Primary Examiner*—Edward P. Westin
*Assistant Examiner*—Jon Santamauro
*Attorney, Agent, or Firm*—Sharp, Comfort & Merrett

[57] ABSTRACT

A programmable logic device includes groups of AND logic function gates, the AND logic function gates in each group coupled to a logic OR function output gate associated with that AND logic function gate group. Each AND logic function gate group includes an output AND logic function gate having inputs that are programmable by respective programmable logic function generators (PLFG) of a set of PLFGs operatively associated with that output AND logic function gate. The PLFGs in any set of PLFGs receive the same sets of first logic input groups, and second programmable inputs. Operation of Boolean function generator output stages to carry out logic operations is controlled by first inputs from the logic OR function gates, and second programmable inputs received from logic cells according to logic inputs to said programmable cells. Inputs from the logic OR function gates are selected by programmable OR logic function generators. The PLFGs and BLFGs comprisise logic circuitry to generate output signals determined by any logic function of a plurality of the first logic inputs, and the second inputs. Using this PLD structure, outputs from the PLD can be used to control logic operations performed by the BLFGs using logic values and instructions originating externally of the PLD.

26 Claims, 14 Drawing Sheets

PROGRAMMABLE LOGIC DEVICE

RELATED PATENTS

This application includes subject matter disclosed and claimed in copending U.S. patent application Ser. No. 07/974,193, filed Nov. 10, 1992 for Configurable Logic Network, assigned to the assignee of this application, the same filing date as this application (Attorney Docket 958075398012).

BACKGROUND OF THE INVENTION

This invention relates to programmable logic devices (PLD) and in particular to folded PLDs that are user programmable.

U.S. Pat. No. 4,872,137 includes disclosure of a folded programmable logic device employing a triangular geometry, using an AND-gate array in which reprogrammable control circuits (RCC) are used to select and control programmable inputs to the AND gates. The RCC design is based on a transmission gate controlled by the user programmable content of a 1-bit shift register. The triangular geometry permits more effective use of semiconductor chip area to implement folded programmable logic devices than use of rectangular arrays employing previously proposed folding techniques. However, while this PLD design is advantageous in terms of versatility of application, operating speed and optimization of AND-gate utilization, it would be desirable to achieve a PLD structured to enable even greater versatility in terms of ability to process more complex Boolean logic inputs. Also, it is desirable to facilitate implementation of user programmable complex logic functions.

SUMMARY OF THE INVENTION

A programmable logic device embodying the present invention includes a plurality of groups of AND logic function gates with the AND logic function gates in each group having respective outputs connected to inputs of an OR logic function gate for that AND logic function gate group. Each AND logic function gate group has one or more individual output AND logic function gates with inputs that are programmable by individually programmable logic function generators (PLFG) of a set of PLFGs operatively associated with that AND gate group. In a preferred embodiment, each PLFG has a plurality of logic input pairs, each PLFG in a set receiving the same logic input pairs. Logic signals are applied as inputs to an AND logic function output gate for that PLFG according to programmable inputs to the PLFG as functions of logic input pairs of that PLFG. For different ones of said AND logic function gate groups, there are different numbers of logic input pairs in the respective logic input pair sets. In this manner, a folded PLD structure may be provided that is user programmable by selection of the control inputs of the PLFGs as a function of the logic inputs to the PLFGs, to provide varied as well as complex logic functions. As integration of complex electronic systems at the single chip and single wafer level increases, embodiments of the invention permit incorporation of programmable logic functions typically required in such systems directly on the system chip or wafer. Alternatively, the programmable logic devices may be provided separately as a single chip or wafer.

For each one of the logic input pairs for a PLFG, an individual programmable cell may be provided having a set of user programmable control inputs from which an output signal is generated as a function of the logic input pair to that programmable cell. The control inputs conveniently may be provided by values stored in a programmable cells which may be provided by one or more volatile or non-volatile memories. In this manner, it is possible to provide an output from a cell selected from any of up to sixteen different logic functions. However, programmable logic devices embodying the invention also may be structured based on sets of more than two logic inputs. The use of logic input pairs is preferred in that it permits a less complex programmable cell designed to be used.

Advantageously, the number of logic input pairs in the respective pluralities of logic input pair sets differs, across a succession of AND-gate groups. In this manner, a programmable logic device may be structured having a layout approximating a right-triangle. The OR logic function gates and AND-gate groups may be disposed in columns along one side, either one of the right-angled sides or the hypotenuse, of said triangle. Alternatively, the OR logic function gates may be embodied within the PLFG array itself.

Such generally triangular shaped PLD arrays may be grouped together to define geometries which enable layout of such groups on a semiconductor chip or wafer in a manner maximizing functional utilization of the available chip surface area and improving cost effective production of such arrays. For example generally rectangular, hexagonal or trapezoidal groupings may advantageously be utilized. Current CMOS fabrication processing may advantageously be used to implement PLDs embodying the invention.

PLDs embodying the invention have utility in applications such as high speed combinatorial logic, system controllers and complex state machines. Thus, they may advantageously be employed as state machine controllers, such as communications controllers between high speed electronic systems having different clocks. For example, in a computer system, one or more conventional PLDs may typically be employed in conjunction with each of various subsystems such as video, RAM, communications, and peripheral interface subsystems, for controlling communications with the CPU. By employing PLD's embodying the invention, integration of the necessary PLDs together with the associated programmable control memory on a single semiconductor chip or wafer in a cost effective manner is facilitated. Flexibility in operation also is enhanced because the programmation of complex logic functions implemented by the PLDs can readily be changed by a user, especially when a user programmable memory is employed to store the control input values.

BRIEF DESCRIPTION OF THE DRAWINGS

By way of example, embodiments of the invention will be described in greater detail with reference to the drawings, in which.

DESCRIPTION OF THE PREFERRED EMBODIMENTS

Figure 1:
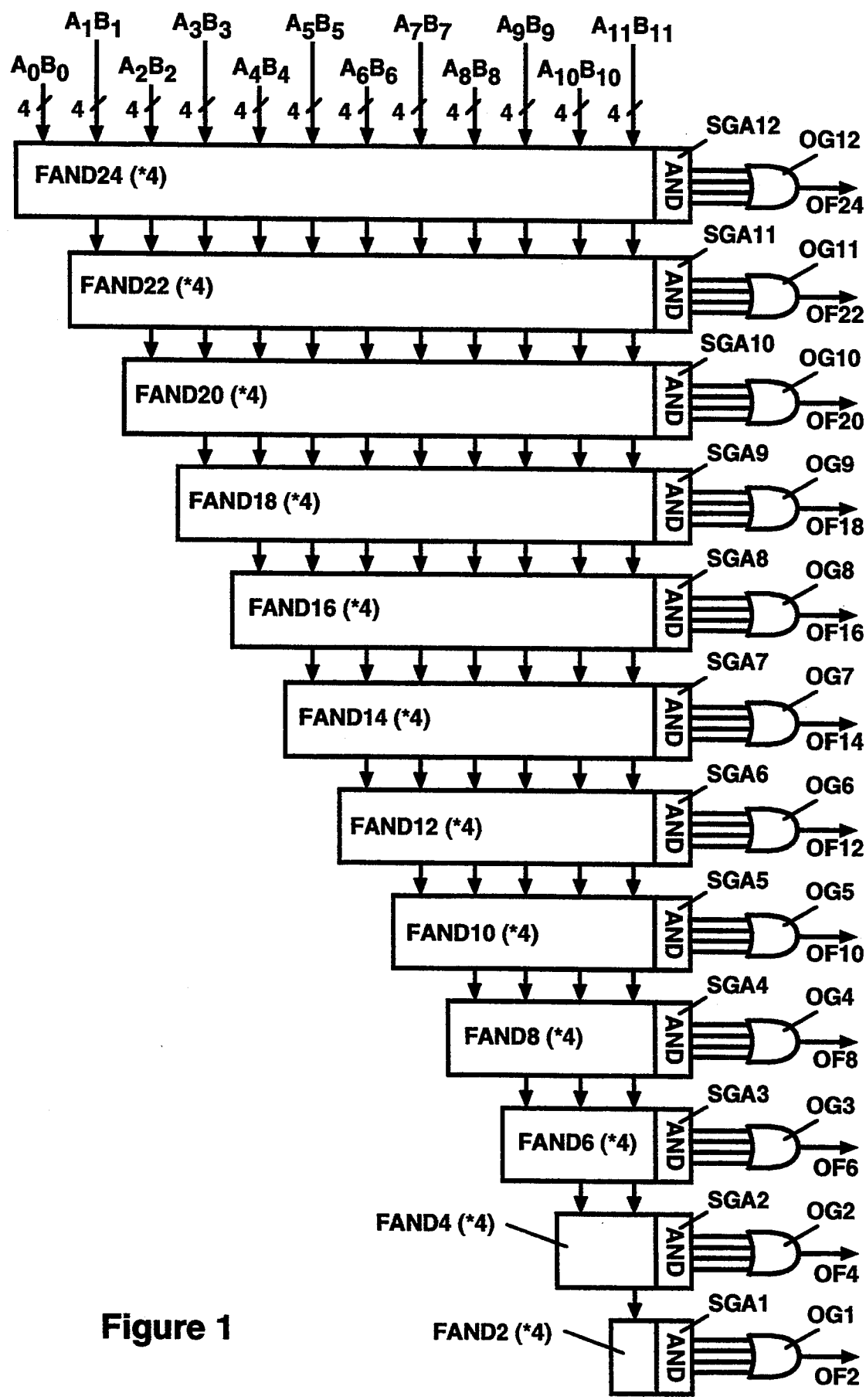
FIG. 1 illustrates the overall arrangement of an exemplary implementation of a PLD embodying the invention.

In the following description, relevant features of a basic form of PLD design suitable for use in implementing the invention will be provided together with various circuit arrangements for utilizing logic outputs from one or more PLDs to enable realization of a wide variety of complex logic operations in a configurable logic network. The logic operations are diverse and may be controlled in part on the basis of user programmable controls stored as values in one or more programmable memories, which may be volatile or non-volatile, suitably of the ROM, PROM, EPROM, EEPROM or RAM variety. Depending on the memory type, mask programming at the factory may be employed or user programming in the field which permits greater flexibility. While, for simplicity, the description will be made in terms of positive logic function implementations using AND OR gates, other implementations are possible, in particular by NOR, NAND and INVERTER gates as when the PLD is fabricated using CMOS technology. Thus, references to "AND logic function" and "OR logic function" contemplate both positive logic and negative logic implementations.

Referring to FIGS. 1–15, FIGS. 1 and 2 show in outline form a preferred folded PLD device employing a group of OR gates OG12 . . . OG1 each of which receives logic product term inputs from respective subgroups of AND gates SGA12 . . . SGA1. Each subgroup comprises four AND gates AG (FIG. 2). In each subgroup, all four AND gates receive user programmable inputs derived from up to twelve logic input pairs A0B . . . A11B11. The programmable inputs for the AND-gate subgroups SGA12 . . . SGA1 are provided by respective sets of programmable logic function generators (PLFG) FAND24, FAND22, FAND20, . . . FAND4, FAND2, each set comprising four PLFGs providing respective inputs to the four AND gates AG in the associated subgroup SGA.

Each PLFG FAND24 provides logic function inputs to an individual AND gate AG in the AND-gate subgroup SGA12, derived from all twelve logic input pairs A0B0 . . . A11B11. The PLFG FAND22 provides logic function inputs to the AND-gate subgroup SGA11 derived from eleven logic input pairs A1B1..A11B11. The PLFG FAND10 provides logic function inputs to the AND-gate subgroup SGA10 derived from ten logic input pairs A2B2 . . . A11B11. The number of logic input pairs from which the logic function inputs for the remaining AND-gate subgroups are derived decreases in this manner in an ordered sequence so that the PLFGs FAND4 and FAND2 provide logic function input pairs to the AND-gate subgroups SGA2 and SGA1 derived from two pairs A10B10 . . . A11B11 and one pair A11B11, respectively, of the logic inputs A0B0 . . . A11B11.

Thus, in sequence, the PLFGs FAND2 to FAND24 comprise AND gate function arrays having increasing numbers of inputs, or conceptionally, the inputs increase in width. In this context, for convenience of description, the PLFGs FAND will sometimes be referred to as having the same or different width, or as narrower or wider.

Figure 2:
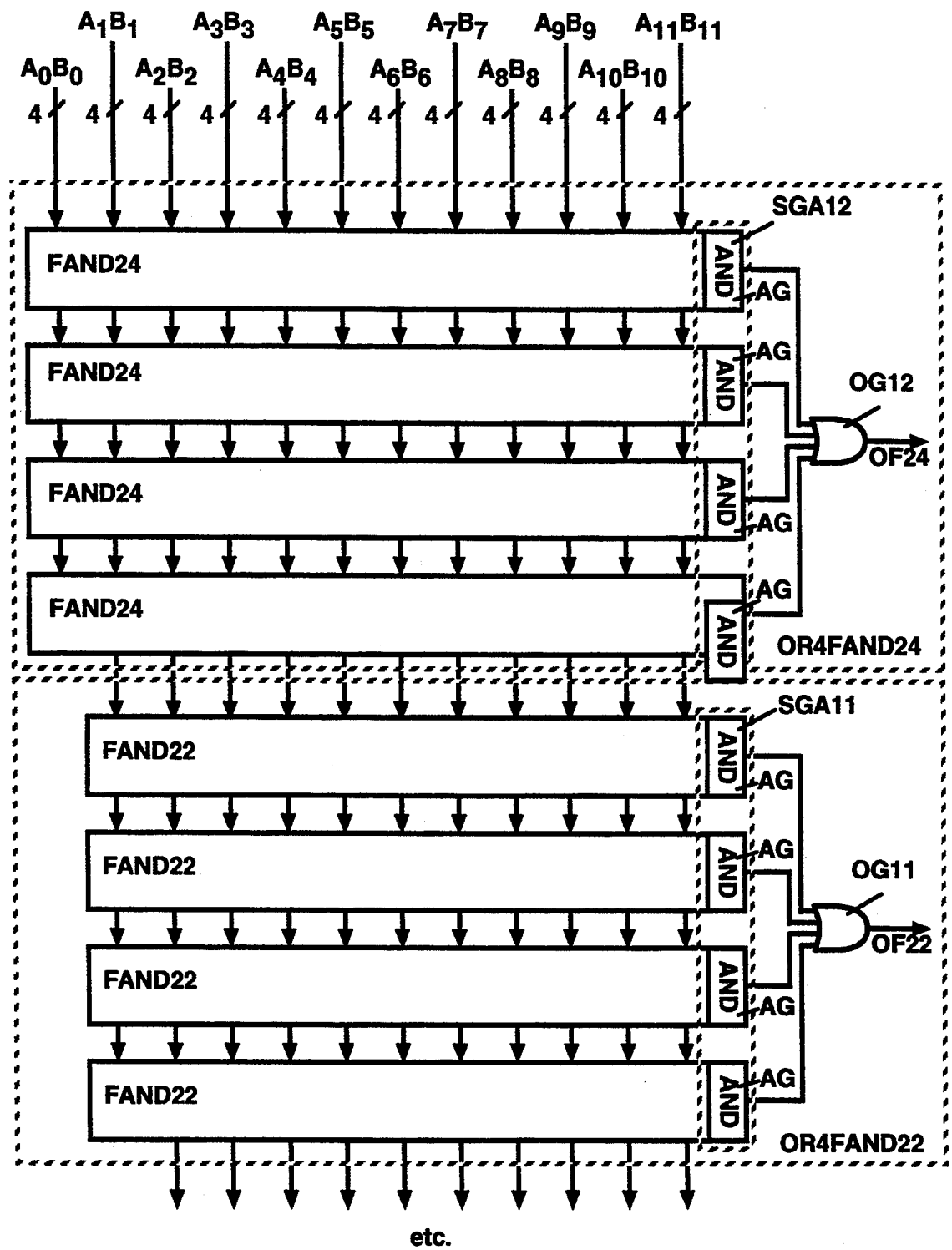
FIG. 2 shows part of FIG. 1 in more detail.

As indicated in FIG. 1, the resultant PLD array can be physically laid out on a semiconductor chip in the approximate form of a right-triangle, the OR gates OG1 . . . OG12 may be located at one of the right-angled sides alongside the AND-gate subgroups SGA1 . . . SGA12, and the area occupied by the PLFG arrays bounded by the other two sides of the triangle. Alternatively, the OR gates could be disposed at selected locations within the AND gate subgroups. As will be discussed later, such a triangular arrangement facilitates PLD layouts in a manner that results in more efficient utilization of chip area.

The use of four PLFGs in each set providing inputs for four AND gates AG in a subgroup SGA is not essential but rather a matter of design convenience. Also, each set of PLFGs need not have an identical number of PLFGs; some may have as few as one PLFGs while others may have two, three, four or more. In addition, disposition of the PLFG sets in a triangular array, although often advantageous, is not essential and folding may also be achieved by other arrangements and sequences. Furthermore, instead of individual sets of PLFGs, the sets, or at least some of them, could be arranged in groups, with the PLFGs sets in each group all receiving the same set of logic input pairs.

Figure 3:
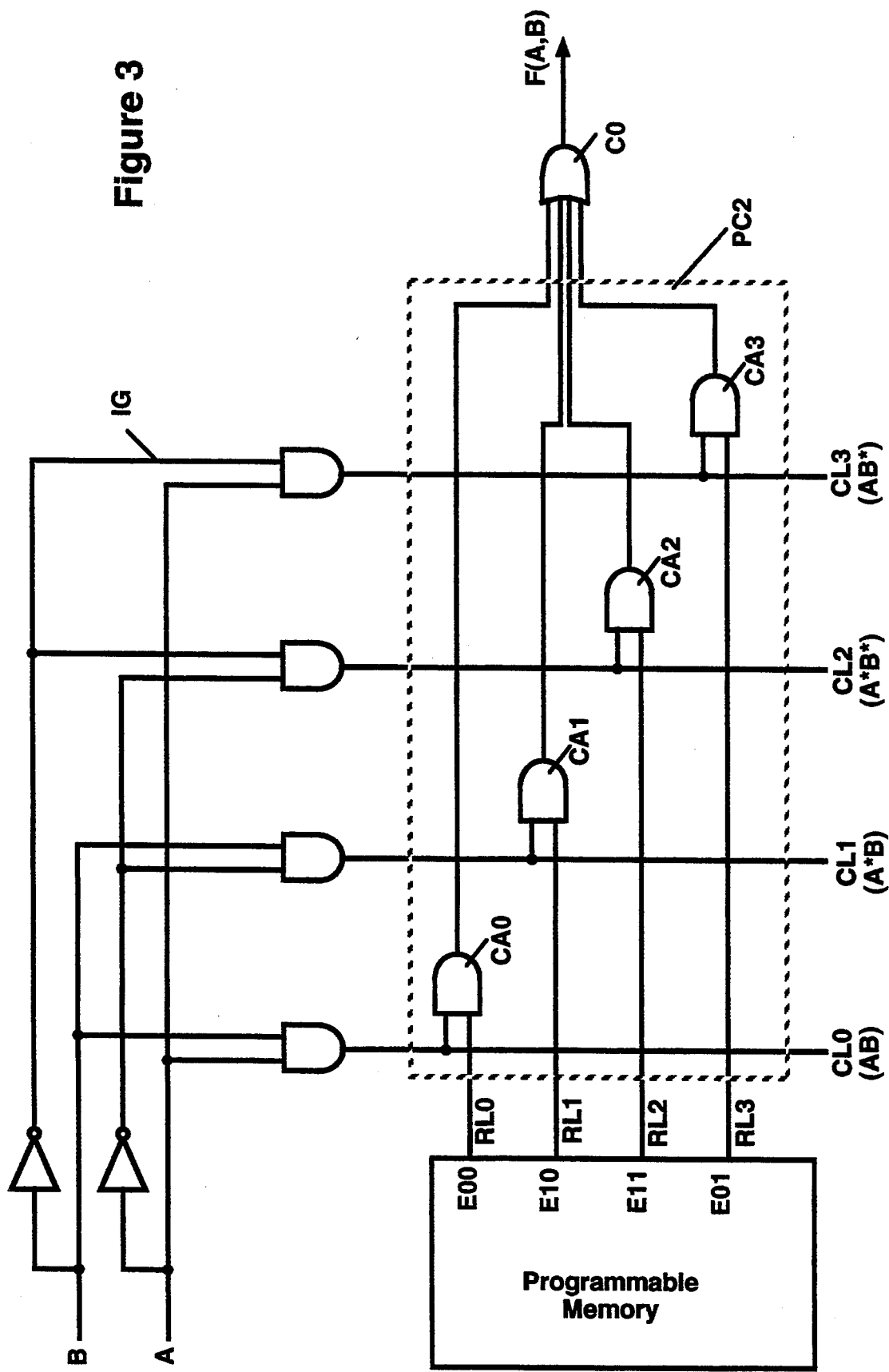
FIG. 3 shows the logic design of a programmable cell utilized in the PLD of FIG. 1.
Figure 7:
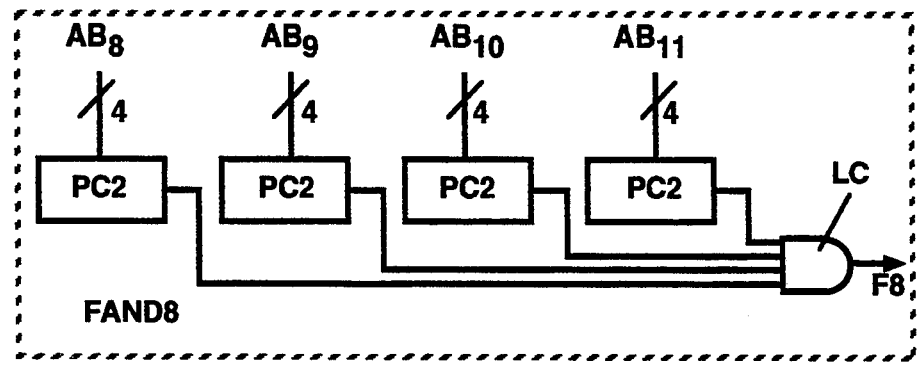
FIGS. 4–15 depict implementations of programmable logic function generators used in FIG. 1.
Figure 6:
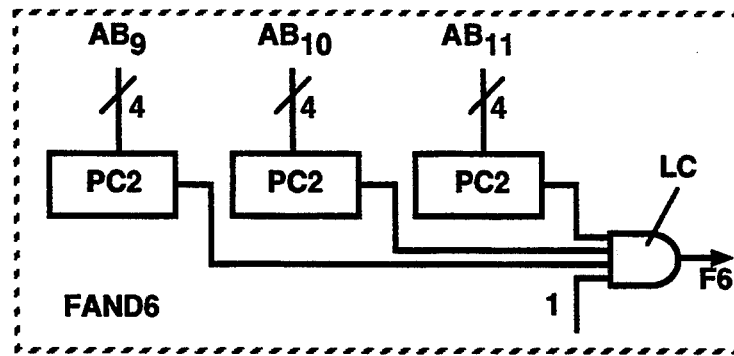
Figure 5:
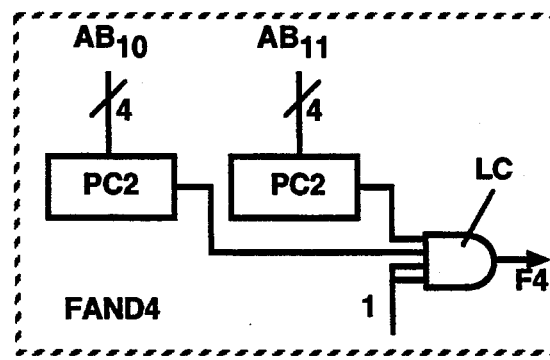
Figure 4:
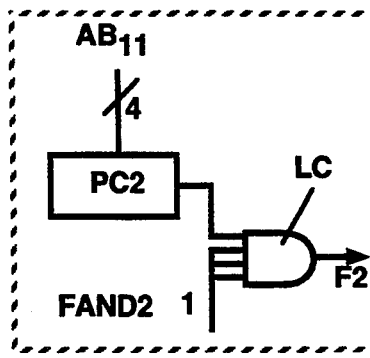
Figure 11:
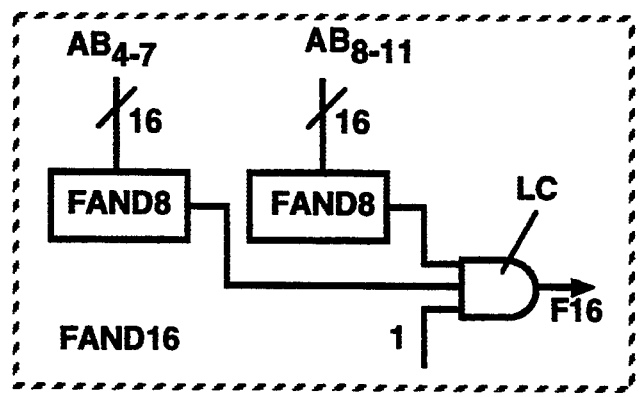
Figure 10:
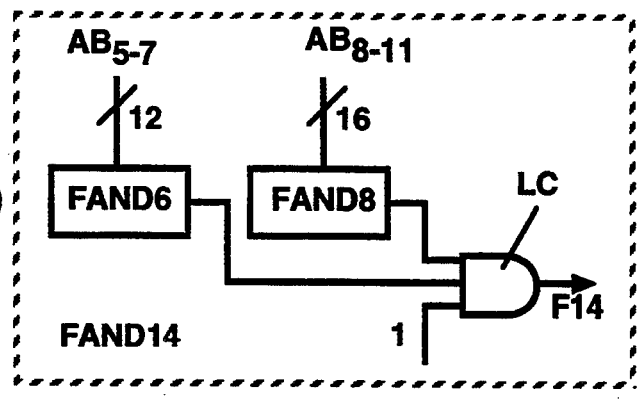
Figure 9:
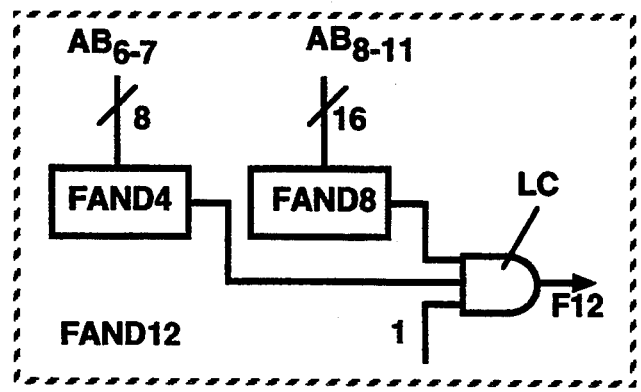
Figure 8:
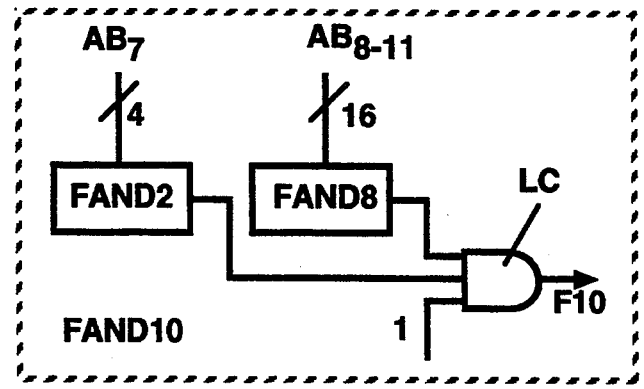
Figure 15:
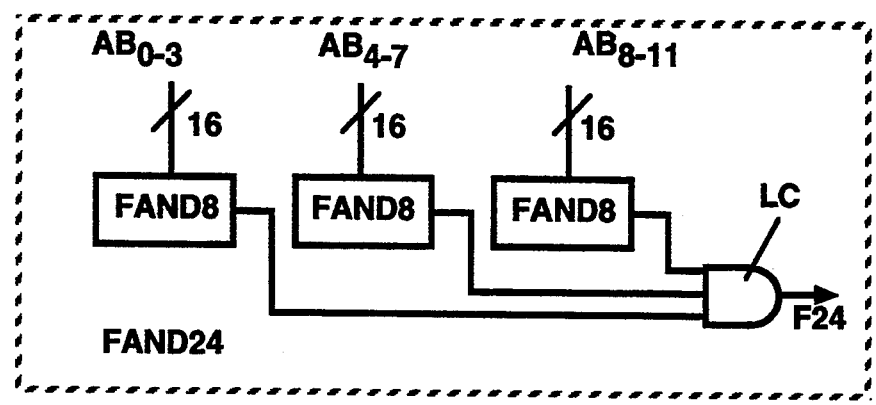
Figure 14:
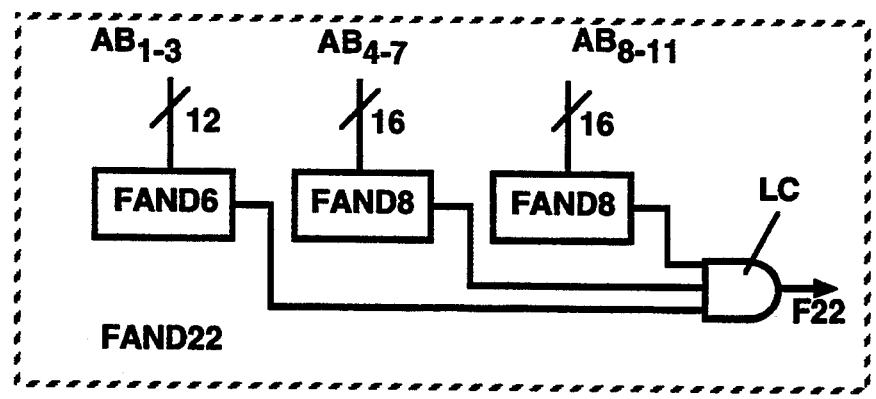

FIGS. 4–15 illustrate examples of the structure and functionality of the PLFGs FAND24 . . . FAND2 each of which comprises one or more programmable cells the design of which is shown in FIG. 3. The programmable cell PC2 includes four AND gates CA0..CA3 the outputs of which are connected as inputs to an OR gate CO providing the logic function output F(A,B) from the cell. The cell also has four column lines CL0 . . . CL3 respectively connected to one input of the AND gates CA0 . . . CA3, and four row lines RL0 . . . RL3 respectively connected to the other input of the AND gates CA0 . . . CA3. An input generator IG receives logic signal input pairs A and B as inputs from which it generates the minterm logic signals A&B, A*&B, A*&B,, A&B*. These logic signals are applied to the column lines CL0 . . . CL3 respectively, while input signals E00, E10, E11, E01 are applied to the respective row lines RL0..RL3, advantageously by connecting the row lines to outputs from a user programmable volatile or non-volatile memory MEM storing the signals E00, . . . E10. Thus, the generated signal F(A,B) from the OR gate CO of the programmable cell is derived from the signals E00, . . . E01 as a function of the logic input combination of A,B fully decoded to implement the sixteen logic functions of the two logic input variables A,B. These logic functions available from the OR gate CO are 0, 1, A, B, A*, B*, A&B, A,&B, A&B*, A,&B*, A&B* OR A*&B(XOR), A&B or A*&B,(XNOR), A or B, A or B*, A* or B, A* or B*. For convenience of comprehension, this programmable cell will subsequently be identified by the reference PC2 denoting that its output is determined by a fully decoded pair of logic inputs. The combined programmable cell PC2 and input generator IG will be referred to as a Universal Boolean Function Generator or "UBFG." Conveniently, the memory MEM has sufficient storage capacity to store signals providing the inputs E01..E11 for the programmable cells in all the PLFGs of the PLD.

FIGS. 4–15 depict PLFGs FAND2 ... FAND24 which employ various combinations of programmable cells PC2 for generating logic function outputs F2 ... F24, respectively derived by increasing numbers of logic input pairs from the sequence A0B0 ... A11B11 (for convenience indicated as AB0 ... AB11) applied to the PLFGs. Thus, while the PLFG FAND2 depicted in FIG. 4 generates an output based on a single logic input pair AB11, the PLFG FAND24 generates a logic function output based on all twelve logic input pairs AB-0-11.

FIGS. 4–7 depict PLFGs FAND2 ... FAND8 having output AND gates LC which receive inputs from one, two, three and four programmable cells PC2, respectively and generate output logic functions F2,F4,F6 and F8. Each AND gate LC each has four inputs and any of those inputs not connected to a programmable cell PC2 is held at a logic 1 level. The programmable cells PC2 of the PLFGs FAND2–FAND8 receive logic pair inputs from their associated input generators IG as indicated below:

| PLFG | LOGIC INPUTS TO GATE LC | | | |
|------|------|------|------|------|
| FAND2 | 1 | 1 | 1 | AB11 |
| FAND4 | 1 | 1 | AB10 | AB11 |
| FAND6 | 1 | AB9 | AB10 | AB11 |
| FAND8 | AB8 | AB9 | AB10 | AB11 |

Figure 13:
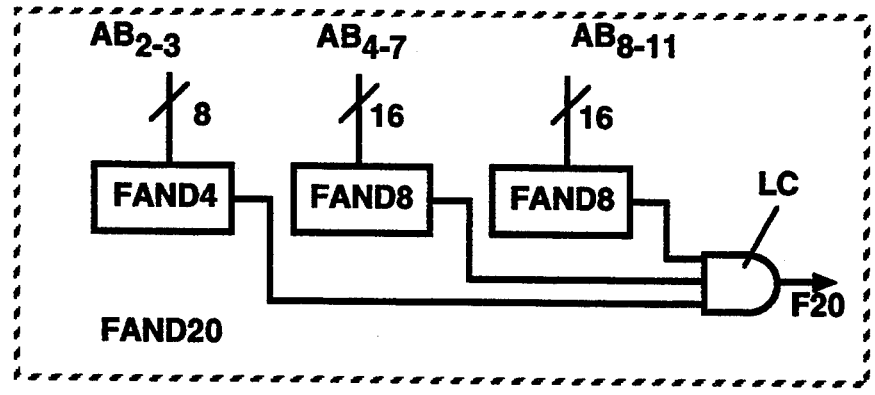
Figure 12:
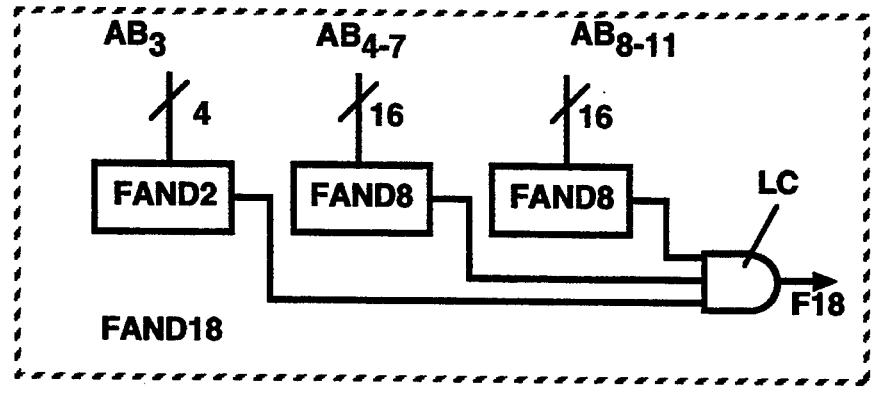

It will be appreciated that to continue to connect individual programmable cell outputs directly to individual inputs of the output gates LC of the PLFGs would significantly increase the structural complexity of the gates LC as the number of logic input pairs associated with that PLFG increases. Thus, for example, the PLFG FAND24 would require an output AND gate having twelve inputs. In order to limit the number of inputs required for the output AND gates LC of the PLFGs FAND10–FAND24, some or all of those inputs are derived from selected PLFGs structured according to FAND2–FAND8 with appropriate changes in logic input pairs. In this manner, it is possible to employ output AND gates LC having three inputs in each of the PLFGs FAND10–FAND24 as shown in FIGS. 8–15. Thus, for example, the PLFG FAND20 depicted in FIG. 13 is shown as employing two PLFGs having an FAND8 structure (FIG. 7) and receiving logic input pair sets AB8-11 and AB4-7, respectively, together with a PLFG having a FAND4 structure (FIG. 5) which receives a logic input pair set AB2-3.

The programmable logic device configuration illustrated above is exemplary only. The number of rows of PLFGs, as well as the number of logic input pairs, could be fewer or greater than those shown in FIG. 1. Further, the number of PLFGs in each rows may be fewer or greater than the four sets illustrated. The particular selection of PLFGs FAND2–FAND8 used in implementation of the PLFGs FAND10–FAND24 is not unique and other combinations than those illustrated could be used. Also, the number of inputs for the output AND gates LC is a matter of design choice and implementation. Additionally, although the AND gates AG in each of the AND gate subgroups SGA12–SGA1 are shown as four-input gates for ease of illustration, fewer or greater numbers of inputs could be used according to particular design implementations.

The PLD thus far described is seen to offer considerable versatility in complexity of logic functions that may be implemented because the basic logic input pair functionalities that can be achieved by each and every one of the programmable cells PC2 can be individually and independently user programmed by the control inputs E00, E10, E11, E01 of each programmable cell. As previously mentioned, these control inputs for the programmable cells of all the PLFGs may be stored in a common volatile or nonvolatile memory. Storage can be controlled by a relatively small number of signals resulting in significantly lower semiconductor chip surface area overhead.

The use of two logic input programmable cells PC2 as described above to implement the programmable logic function generators in the programmable AND logic gate array is significantly advantageous compared with implementation of AND gate arrays in conventional programmable logic devices. For example, a conventional programmable logic device may support the following logic functions of two logic inputs

A, B: 0, 1, A, B, A*, B*, A&B, A*&B, A&B*, A*&B*.

However, by employment of a programmable cell PC2 in a PLD structure embodying the invention, it has been found possible to support, in addition, the following logic functions:

A&B* or A*&B(XOR); A&B or A*&B* (XNOR);

A or B; A or B*; A* or B; A* or B*.

The resultant advantage may be appreciated by considering the comparison of two 3-bit logic values using a program PLD embodying the invention and employing PC2 cells as described above, and a conventional programmable logic device. In a conventional device, eight different comparisons would need to be carried out to determine equality between the compared values, wherein using PC2 cells in an embodiment of the convention, equality could be determined using three PC2 cells in one PLFG:

Eq=(A3 XNOR B3) & (A2 XNOR B2) & (A1 XNOR B1)

In alternative embodiment of the invention, programmable cells using logic input sets of more than two logic signals could be used, but with greater complexity of the cell structure. For example, for three inputs, eight AND gates CA and eight programmable inputs would be required whereas for four logic inputs, sixteen AND gates CA and programmable inputs would be required. Likewise, corresponding increases in gates in the IG array would be required. In general, for n logic inputs, $2^n$ AND gates with corresponding logic input signals and programmable inputs would be necessary.

The invention thus enables a PLD to be constructed using fewer AND gates in the AND gate array than in a conventional programmable logic device, for implementing a particular level of functional complexity thereby permitting faster operation.

Figure 16:
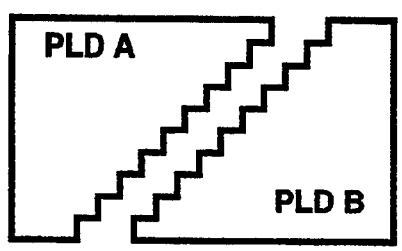
FIGS. 16 and 17 depict how triangular arrays as illustrated by FIG. 1 can be utilized to form rectangular, hexagonal and part-hexagonal arrays.
Figure 16:
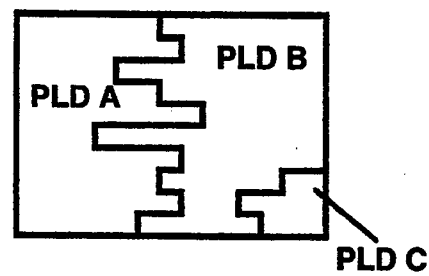
Figure 17:
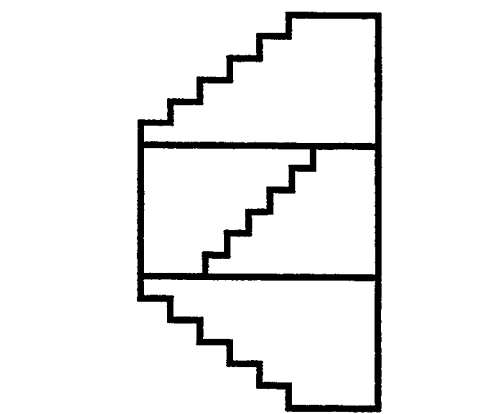
Figure 17:
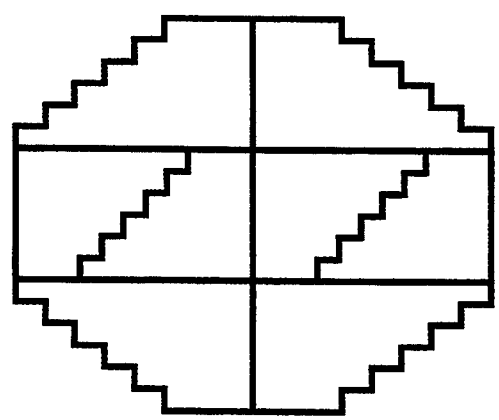
Figure 17:
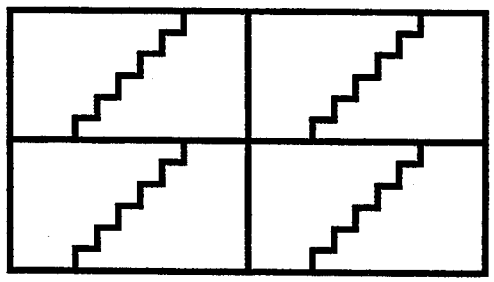
Figure 17:
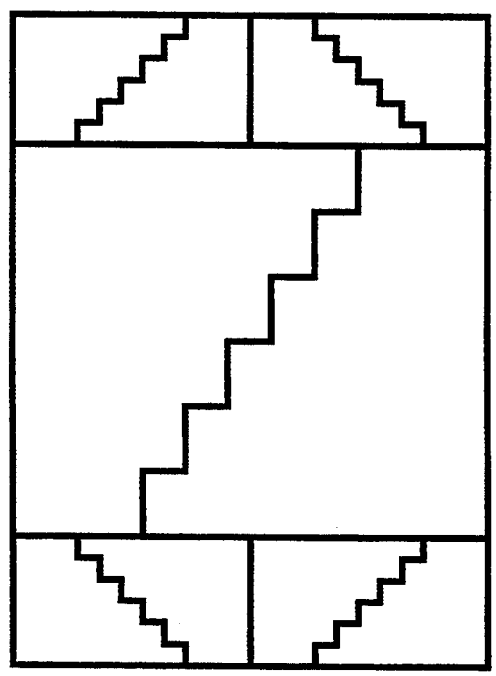
Figure 17:
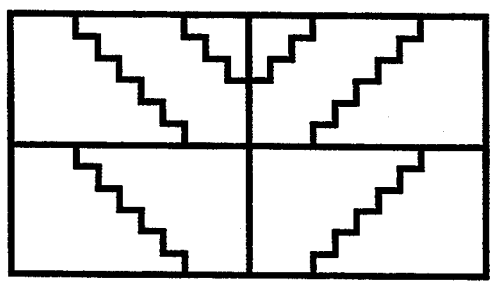

The triangular configuration of the PLD array previously referred to enables a multiplicity of array blocks to be laid out and integrated on a semiconductor chip in a manner enhancing chip area utilization and enabling a more cost effective single chip solution for applications requiring multiple conventional PLDs. For example, as shown in FIG. 16, pairs of triangular arrays PLDA and PLDB can be aligned to define rectangular blocks. Alternatively, as shown in FIG. 16, a rectangular array may be constructed using three PLDs, PLDA, PLDB and PLDC having interleaved sets of PLFGs. In addition, hexagonal and trapezoidal (half-hexagonal) blocks can be achieved by layouts of triangular arrays as indicated in FIG. 17. FIG. 17 also depicts other ways in which PLDs embodying the invention may be shaped and arranged to form overall rectangular arrays. In this manner, wafer scale integration of many folded PLD arrays embodying the invention may be achieved, with signals for the user programmable inputs E00 ... E11 of the PLFGs for all of the PLDs conveniently stored in a common, volatile or non-volatile memory integrated on the same semiconductor chip, if so desired. Thus, not only is system level chip integration facilitated but in addition, minor or major modifications in the logic functions implemented by some or all of the PLDs can readily be implemented in the field by user programmation of the PFLG control inputs. Such user programmation is particularly facilitated by storage of the control input values in on-chip programmable memory.

Additional versatility can be obtained and also still more complex user programmable configurations, by using the outputs from the OR gates OG of a PLD from which are derived logic inputs to additional programmable Boolean function generators. Examples of such arrangements will be described with reference to FIGS. 18–24. In each of those figures, four OR gates OGk, OG1, OGm and OGn, providing ORed outputs from corresponding width FAND arrays of a PLD are depicted by way of example. However, the OR gates could be selected from any two or more FAND arrays of a PLD as required. Also, different sets of OR gates OG could be used to for derivation of logic inputs to different Boolean function generators. The arrangements to be described with reference to FIGS. 18–24 may be employed with the PLD as described with reference to FIGS. 1–15 as well as individual PLDs in arrangements as shown in FIGS. 16 and 17.

Figure 18:
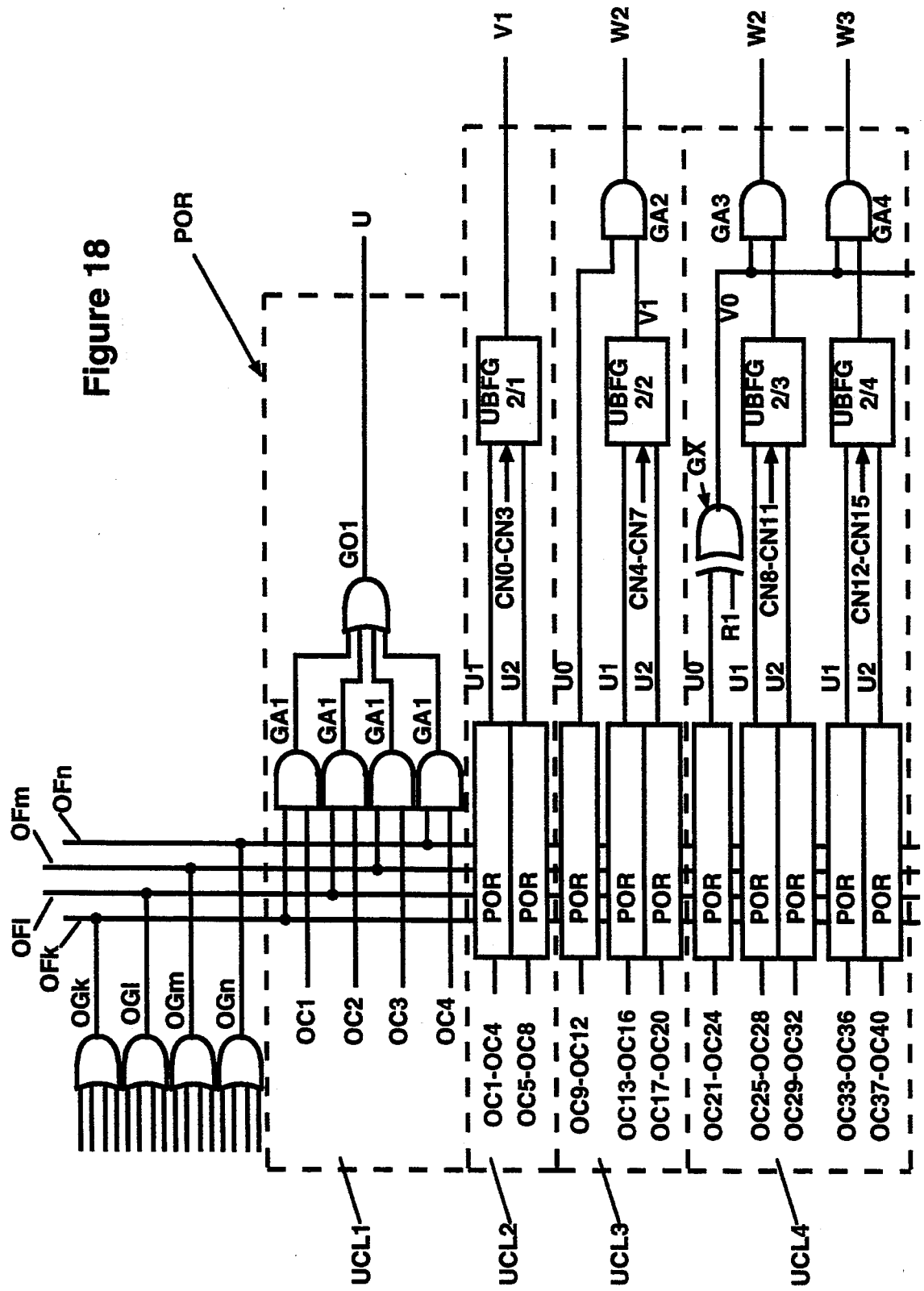
FIGS. 18–23 depict various logic networks using PLD outputs to control more complex logic functions.

FIG. 18 depicts several different user programmable control logic circuits UCL1, UCL2, UCL3, and UCL4 to which, by way of example, the logic outputs from OR gates OGk, OG1, OGm and OGn are connected to generate more complex logic outputs. The circuits UCL1–UCL4 are all shown connected to the outputs of the same OR gates OG for convenience of description. In practice, different groups of OR gates from one or more PLD could serve as the inputs to differing UCL circuits.

The control logic circuit UCL1 comprises a programmable input OR gate circuit POR having four AND gates GA1 connected to receive the respective inputs OFk, OF1, OFm and OFn, together with an OR gate GO1 the inputs of which are supplied by the AND gates GA1. The AND gates GA1 also receive respective selected control input signals OC1 ... OC4 which may be generated by volatile or nonvolatile memory. The OR gate GO1 produces an output signal U=OFk&OC1 OR OF1&OC2 OR OFm&OC3 OR OFn&OC4.

The control logic circuits UCL2, UCL3 and UCL4 each contains two or more programmable input OR gate circuits POR which have the same configuration as in the control logic circuit UCL1, except that the control inputs OC1 ... OC4 can be individually selected for each circuit POR.

The control logic circuit UCL2 comprises two programmable input OR circuits the outputs U1 and U2 from which provide a logic input pair for a Universal Boolean Function Generator (UBFG2/1) which may be implemented by a programmable cell PC2 and input generator IG as described with reference to FIG. 3. The input pair U1,U2 corresponds to the logic input pair A,B in FIG. 3. The UBFG2 receives programmable input signals corresponding to E00 ... E01 in FIG. 3 on inputs CN0 ... CN3 the programmation of which determines the output signal $V1 = F_{CN0...CN03}(U1,U2)$ where U1 and U2 have the same form as the output U from the control logic circuit UCL1.

In the control logic circuit UCL3, the output U0 from a control circuit UCL1 and the output V1 from the UBFG2/2 of a control logic circuit UCL2 provide inputs to an AND gate GA2 to produce an output W1=U0&V1.

In the control circuit UCL4, the outputs V2 and V3 from UBFG2/3 and UBFG/4 of two control logic circuits UCL2 are applied as inputs to respective AND gates GA3 and GA4. An EXCLUSIVE-OR gate GX receives an input U0 from a control logic circuit UCL1 and an input logic signal R1 (which may be an external programmable control signal) and has an output connected to inputs of each of the AND gates GA3 and GA4. The control logic circuit UCL4 thus produces outputs W2=V0&V1A and W3=V0&V1B, where V0=R1 XOR U0. R1 and U0 can be used to force a particular output value for W2 and W3. R1=1 effectively implements the inversion of U0 which is particularly useful. Such an implementation could be achieved using an inverter instead of the EXCLUSIVE-OR gate GX.

The inputs CN0 ... CN15 for UBFG2/1... UBFG2/4 may be individually programmed or generated in a programmable fashion and, if desired, may be derived from signals stored in either volatile or nonvolatile memory. The memory may be either field or factory programmable.

Figure 19:
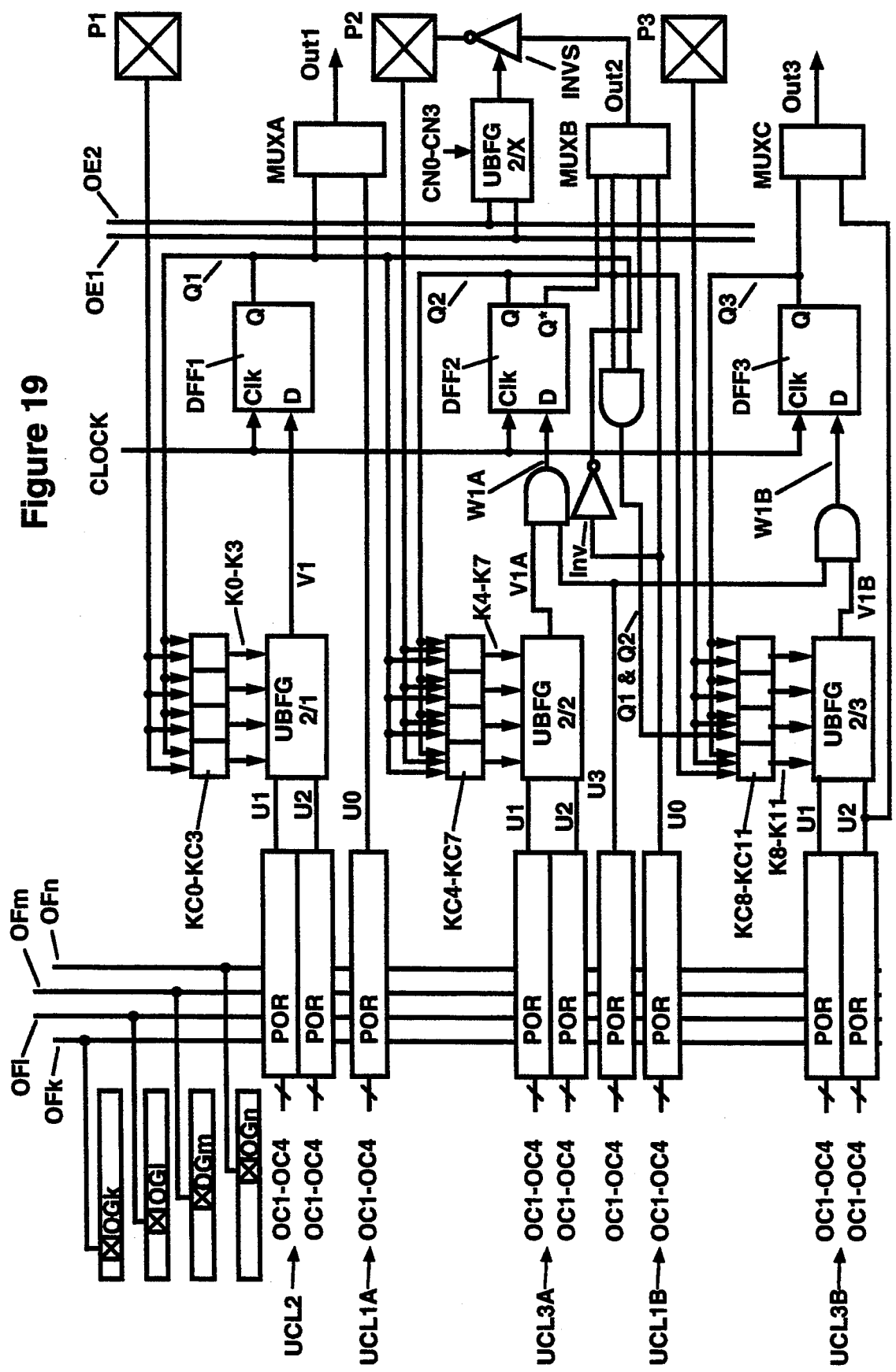

FIG. 19 depicts additional ways in which outputs OFk, OF1, OFm, OFn from a PLD may be utilized in conjunction with logic control circuits UCL as described with reference to FIG. 18. The logic output V1 from the UBFG2/1 of a control logic circuit UCL2 is connected as an input to a temporary register as store, shown as a D flip flop DFF1. The flip flop input is transferred to the Q output at the next clock pulse on the clock line CLOCK. Two control logic circuits UCL3A and UCL3B have AND gates which receive respective outputs V1A and V1B from UBFG2/2 and UBFGR/3 of control logic circuits UCL3A and UCL3B as well as inputs U3 from a common UCL1-type programmable OR gate circuit. The logic outputs W1A and W1B from the control logic circuits UCL3A and UCL3B provide respective inputs to D flip-flops DFF2 and DFF3, also clocked by the clock line CLOCK.

The Q outputs Q1, Q2 and Q3 from the flip-flops DFF1, DFF2 and DFF3 may be used as external logic signals. Those Q outputs also may be transferred from the flip flops DFF1, DFF2 and DFF3 to programmably controlled logic generation cells KC0..KC3 KC4..KC7 and KC8 ... KC11 which generate signals K0 ... K3, K4 ... K7 and K8 ... K11 for the inputs CN0 ... CN3 of the UBFG2/1–UBFG2/3, respectively.

Figure 20:
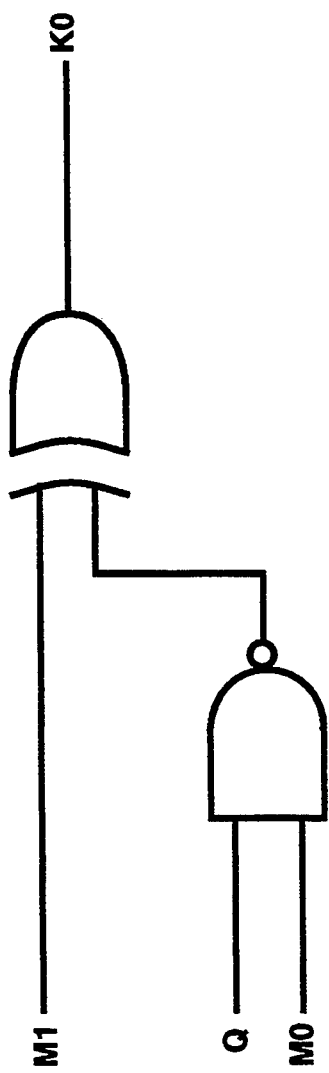

An example of a suitable programmably controlled logic function cell K for the cells KC0 ... KC3 is illustrated in FIG. 20 and comprises an EXCLUSIVE OR gate having a first input connected to receive the logic signal value M1 from a programmable memory cell. A NAND gate has two inputs, one connected to receive the logic signal value M0 from a programmable memory cell and a second input connected to receive the Q output from the flip flop DFF1. The output K0 from the cell K is thus determined according to:

| M0 | M1 | K0 |
|----|----|------|
| 0  | 0  | 1    |
| 0  | 1  | 0    |
| 1  | 0  | Q1   |
| 1  | 1  | Q1*  |

As thus far described, the control inputs K0 ... KC3 for UBFG2/1 from the cells KC0 ... KC3 could thereby each be selected from: K0 ... K3 ∈ {0,1,Q1,Q1*} using logic signal values M0 and M1 stored in programmable memory cells as selection signals applied to each one of the cells KC0 ... KC3.

In addition, external logic signals may also be supplied from a port P1 (for example a terminal pin on a semiconductor chip on which the PLD(s) and control logic circuitry are integrated) and used to enter values as input signals to the programmably controlled logic cells KC0 ... KC3 for providing the control inputs K0 ... K3 to UBFG2/1. The control inputs K0 ... K3 for UBFG2/1 of the control logic circuit UCL2 then could be selected from: K0 ... K3 ∈ {0,1,Q1,Q1*,P1}, using as selection signals, values M0, M1 and M2 stored in volatile or nonvolatile memory cells. These programmably controlled logic signal generator cells could be designed using conventional design procedures and would implement the following truth table:

| M0 | M1 | M2 | K0  |
|----|----|----|-----|
| 0  | 0  | 0  | 0   |
| 0  | 0  | 1  | 1   |
| 0  | 1  | 0  | Q1  |
| 0  | 1  | 1  | Q1* |
| 1  | 0  | 0  | P1  |

UBFG2/2 and UBFG2/3 of the control logic circuits UCL3A and UCL3B also receive at their inputs CN0 ... CN3 signals K4 ... K7 and K8 ... K11 from programmably controlled logic generation cells KC4 ... KC7 and KC8 ... KC11, respectively. Cells KC6, KC7, KC10 and KC11 are designed and controlled in a similar manner to the cells KC0 ... KC3 as described above, with cells KC6, KC7 receiving inputs Q2 from the flip flop DFF2 and from the external pin P2 while the cells KC10 and KC11 receive inputs Q3 from the flip flop DFF3 and from the external pin P3.

The function cells KC4 and KC8 also receive Q1 from the flip flop DFF1 and Q2 from the flip flop DFF2, respectively, as SHIFT inputs. Q1 also is applied as a COUNTER propagation input to the function cell KC5 while the ANDED signal Q1&Q2 is applied as a COUNTER propagation input to the cell KC9.

The inputs K4 and K8 generated by the logic signal generator cells KC4 and KC8 for UBFG2/2 and UBFG2/3 of the control logic circuits UCL3A and UCL3B then could be selected from: K4 ∈ {0,1,Q2,Q2*,SHIFT,P2}, and K8 ∈ {0,1,Q3,Q3*,SHIFT,P3}, using as selection signals, values M0, M1 and M2 stored in volatile or nonvolatile memory cells. The programmably controlled logic generation cells KC4 and KC8 could be designed using conventional design procedures to implement the following truth table:

| M0 | M1 | M2 | K0    |
|----|----|----|-------|
| 0  | 0  | 0  | 0     |
| 0  | 0  | 1  | 1     |
| 0  | 1  | 0  | Q2    |
| 0  | 1  | 1  | Q2*   |
| 1  | 0  | 0  | P     |
| 1  | 1  | 0  | SHIFT |

Shifting operations performed using KC4/KC8 type logic generation cells in the manner described above enable the temporary stores DFF1, DFF2 and DFF3 to be loaded from one pin Px by a succession of clocked operations. This allows the implementation of Parallel-In-Serial-Out and Serial-In-Parallel-Out shift registers to be functionally integrated into one circuit. This circuit can then be used to process these signals for functions such as Boolean polynomial calculations, which are extensively used in implementing Error Detection and Correction Coding schemes.

Similarly, the inputs K5 and K9 generated by the cells KC5 and KC9 for UBFG2/2 and UBFG2/3 of the control logic circuits UCL3A and UCL3B could be selected from: K5 ∈ {0,1,Q2,Q2* COUNT XOR Q2,P2}, and K9 ∈ {0,1,Q3,Q3*,COUNT XOR Q3,P3}, using as selection signals, values M0, M1 and M2 stored in volatile or nonvolatile memory cells. The programmably controlled logic generation cells KC5 and KC9 could be designed using conventional design procedures to implement the following truth table:

| M0 | M1 | M2 | K0          |
|----|----|----|-------------|
| 0  | 0  | 0  | 0           |
| 0  | 0  | 1  | 1           |
| 0  | 1  | 0  | Q           |
| 0  | 1  | 1  | Q*          |
| 1  | 0  | 0  | P           |
| 1  | 0  | 1  | COUNT XOR Q |

Thus, counter functionality can be obtained by connecting additional UCL3-type stages and their associated D flip flops and function cells corresponding to KC8 ... KC11, with the KC9 type programmable function cells receiving inputs derived from the D flip flop of that stage and from the D flip flop of the preceding stage in the manner shown in FIG. 19 for an Up Counter function. Down Counter and Up/Down Counter functions can be obtained by appropriate changes in the connections between the Q and Q* outputs from the D flip flops to the KC9 type programmable logic generation cells of neighboring stages. The counter functions are described according to the following relations:

Assume an n-bit counter with bits $Q1, \ldots Qn$;

Count Up:

$Qi$(next) = $Qi$(now) XOR CountUpi

CountUpi = 1 if $i = 1$
= $Q1 \& Q2 \& \ldots Qi - 1$ if $i > 1$

Count Down:

$Qi$(next) = $Q1$(now) XOR CountDowni

-continued

CountDown$_i$ = 1 if $i$ = 1
= $Q1^* \& Q2^* \& \ldots Qi - 1^*$ if $i > 1$

Count Up/Down (UpDown Controlled):

$QI$(next) = $Qi$(now) $XOR$ CountUpDown$_i$

CountUpDown$_i$ =

CountUp$_i$ & UpDown OR CountDown$_i$ & UpDown*

Additional versatility of the configurable network as thus far described with reference to FIG. 19 can be obtained in the following manner: The Q outputs from any or all of the flip flops DFF1, DFF2 and DFF3 and the outputs from programmable OR gates POR may be used to provide external logic signals. As shown in FIG. 19, the DFF1 flip flop output Q1 and the logic signal U0 from an additional control circuit UCL1A are applied as inputs to a 2-to-1 multiplexer MUXA. Alternatively, the Q output from a flip flop and the output from a programmable OR gate of a UCL3-type control circuit could be applied as inputs to a multiplexer. This is illustrated in FIG. 19 by the connection of the Q3 output from the flip flop DFF3 and of the U2 output from a programmable OR gate of the control circuit UCL3B to a 2-to-1 multiplexer MUXC. For greater flexibility, a flip flop Q output and a logic signal output from a programmable OR gate together with their inverted values could be applied as inputs to a 4-to-1 multiplexer to provide for output signal polarity selection. Thus, in FIG. 19, the multiplexer MUXB receives the Q2 and Q2, outputs from the flip flop DFF2 while a logic signal U0 from an additional programmable OR gate UCL1B is applied directly and via an inverter INV as inputs to the multiplexer MUXB.

FIG. 19 also includes circuitry permitting a multiplicity of enable inputs to be used to select connection of the output from a multiplexer to an external pin. Thus, the output from the multiplexer MUXB is connected via a switched inverter INVS to the external pin P2. An enable input for the inverter INVS is provided by a Universal Boolean Function Generator UBFG2/X implemented as described with reference to FIG. 3. Output enable signals OE1 and OE2 provide the logic input signals to UBFG2/X (equivalent to logic signals A and B in FIG. 3) and the signals to inputs CN0 . . . CN3 may be provided by values which may be stored in a volatile or nonvolatile memory, in the same manner as the stored values E00 . . . E01 in FIG. 3.

In this manner, any of the sixteen logical functions of inputs OE1 and OE2 are available for selecting connection of the output from the multiplexer MUXB to the external pin P2. Similar output enable selection circuitry could also be used in conjunction with other output selection multiplexers such as MUXA and MUXC.

Figure 21:
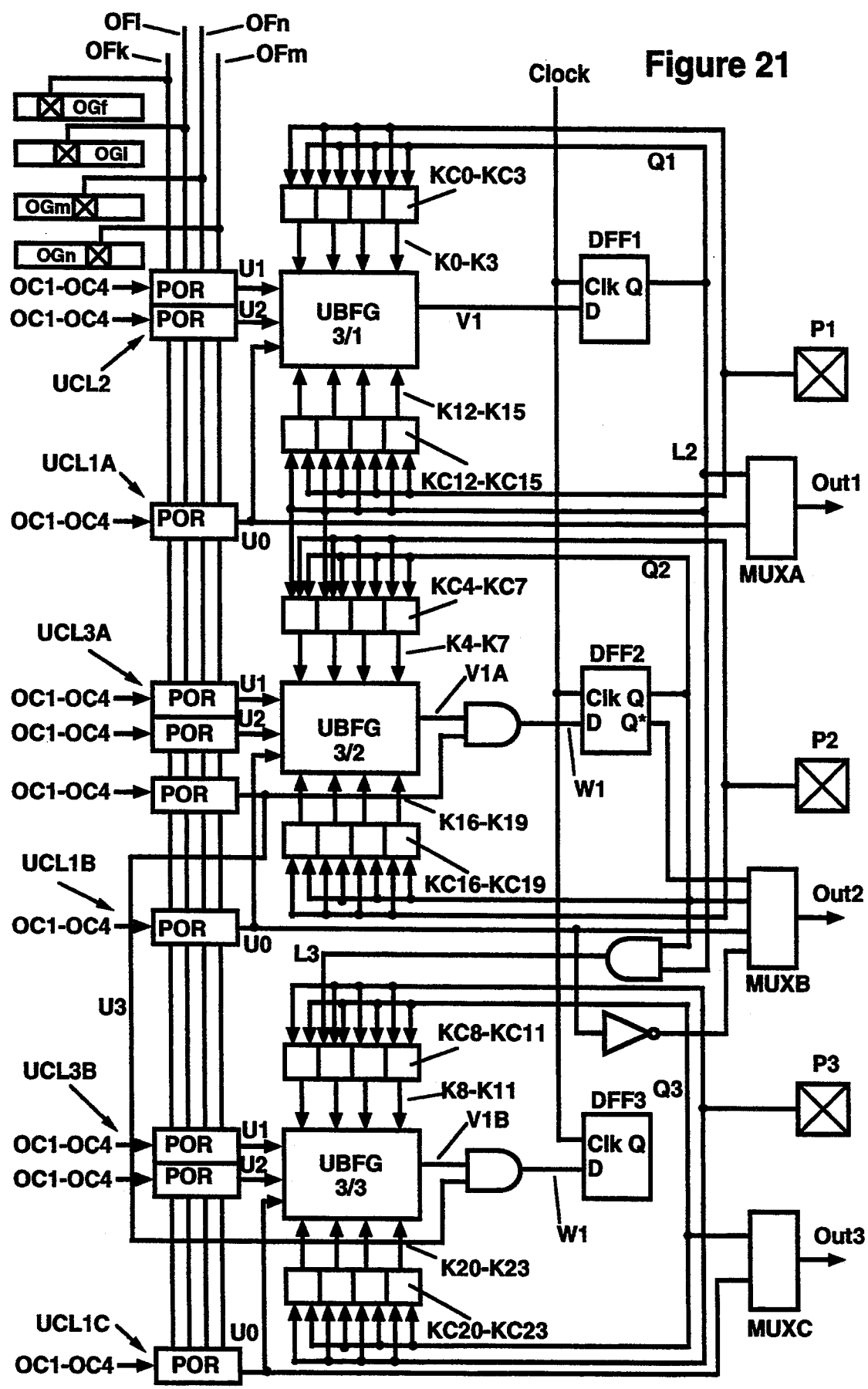

FIG. 21 shows an arrangement similar to that shown in FIG. 19 but employing three—logic—input Universal Boolean Function Generators UBFG3 in place of the two—logic—input generators UBFG2 as shown in FIG. 19. As previously explained, this three input Boolean function generator requires eight control input signals to achieve full logic function generation of the three input signals. Thus, in FIG. 21, UBFG3/1. UBFG3/2 and UBFG 3/3 of the control logic circuits UCL2, UCL3A and UCL3B receive an additional logic input U0 from respective control logic circuits UCL1A, UCL1B and UCL1C. The necessary four additional signals K12 . . . K15, K16 . . . K19, and K20 . . . K23 for each of these UBFGs are provided by additional groups of programmably controlled logic generation cells KC12 . . . KC15, KC16 . . . KC19, and KC20 . . . KC23, respectively.

Figure 22:
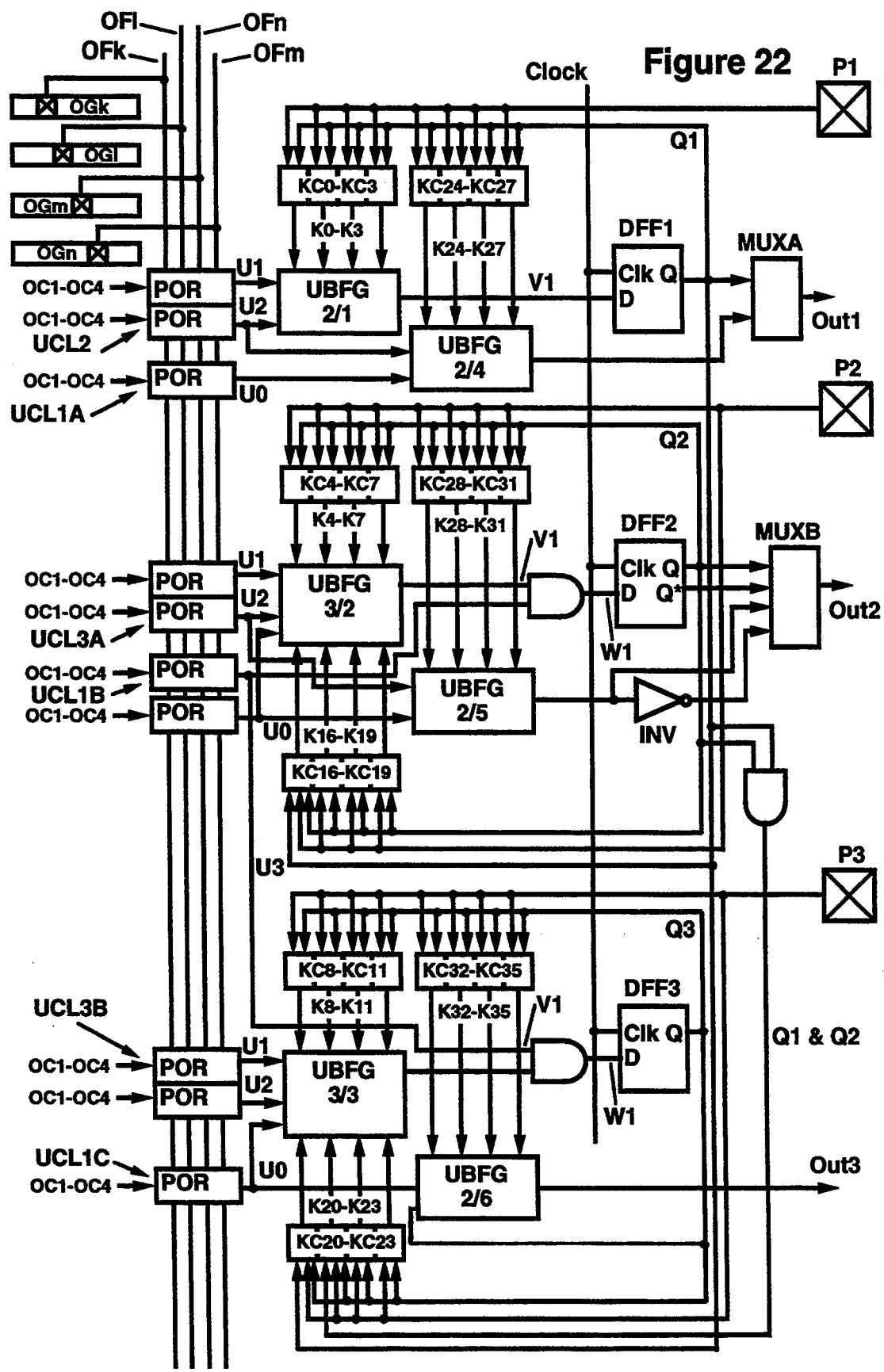

FIG. 22 shows further extensions of the arrangement shown in FIG. 21. Instead of connecting the logic output U0 from the control logic circuit UCL1A directly to the multiplexer MUXA, it is connected to provide one of a pair of logic inputs to a two—logic—input Universal Boolean Function Generator UBFG2/4. The output U2 from the control logic circuit UCL2 provides the second logic input for UBFG2/4 while the output from UBFG2/4 is connected to an input of the two-to-one multiplexer MUXA. A set of four programmably controlled logic signal generator cells KC24 . . . KC27 are connected to provide signals to the inputs CN0 . . . CN3 for the UBFG2/4. The function generation cells KC24 . . . KC27 receive a Q input from the flip flop DFF1 and an external pin input from pin P1. (It should be noted that whereas in FIG. 21 UBFG3/1 of the control logic circuit UCL2 has three logic inputs, it is shown in FIG. 22 as a generator UBFG2/1 having two logic inputs.

Also in FIG. 22, the multiplexer MUXB is shown as receiving true and inverted outputs from a two-logic input Universal Boolean Function Generator UBFG2/5 connected (in a manner analogous to UFBG2/4) to receive as inputs, the logic control signal U0 from the control logic circuit UCL1B and the logic output signal U2 from the control logic circuit UCL3A. Control signals K28 . . . K31 for UBFG2/5 are derived from four programmably controlled logic signal generator KC28 . . . KC31 which receive Q2 and P2 inputs from the flip flop DFF2 and the external pin P2.

FIG. 22 also shows an alternative manner of selecting output signals that can be used instead of multiplexers. For example, the multiplexer MUXC of FIG. 21 is replaced in FIG. 22 by an Universal Boolean Function Generator UBFG2/6 connected to receive one logic input signal U0 from the control logic circuit UCL1C, the second logic input signal being provided by the Q3 output from the flip flop DFF3. A group of programmably controlled logic function cells KC32 . . . KC35 receive Q3 and P3 inputs from the flip flop DFF3 and the external pin P3, respectively. The logic signals output from those function cells are connected to provide control input signals K32 . . . K35 for control inputs CN0 . . . CN3 of the UBFG2/6. This arrangement provides additional versatility compared with use of a multiplexer for output signal selection.

Figure 23:
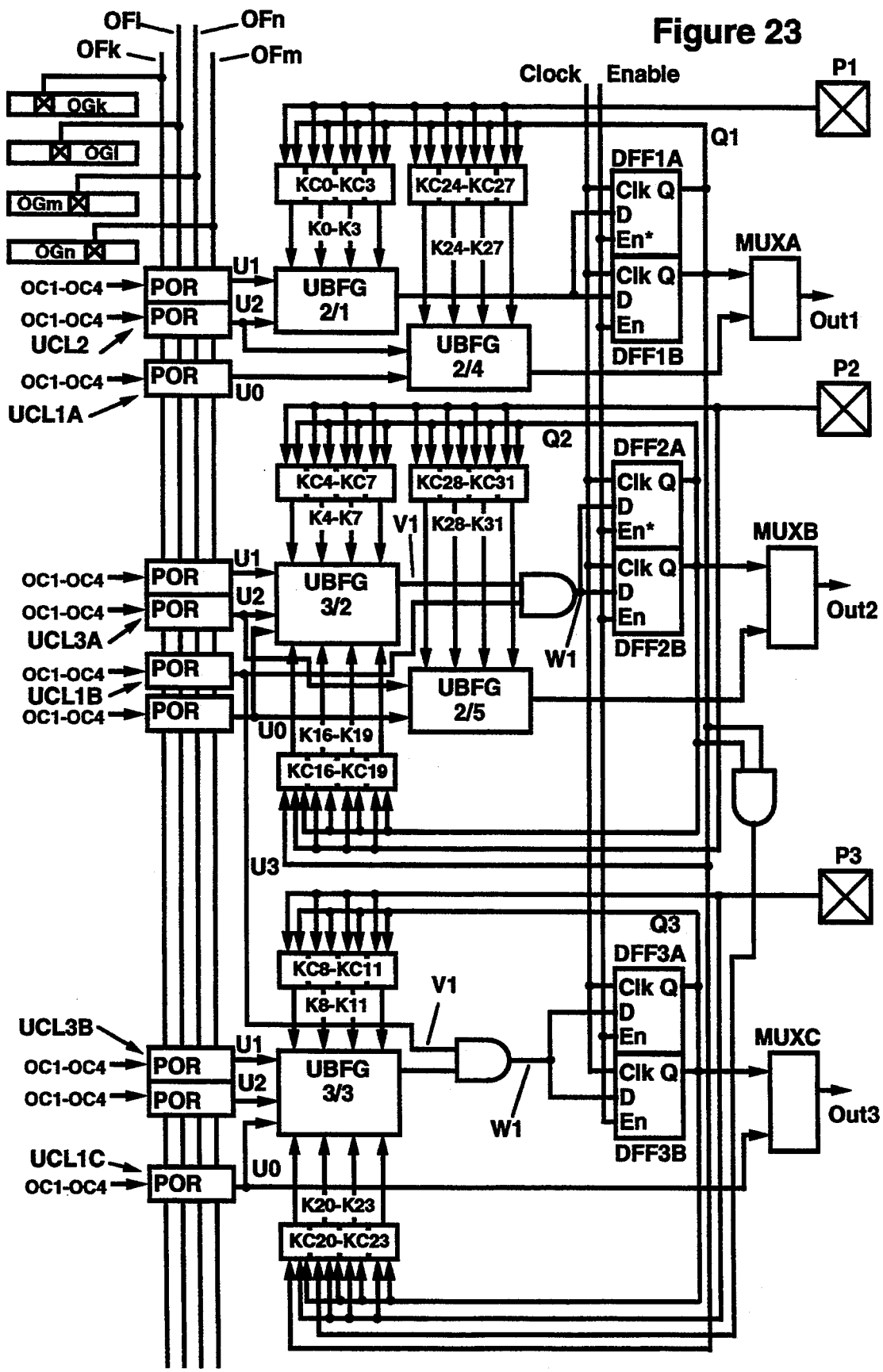

FIG. 23 illustrates a further development of the arrangement shown in FIG. 22 in which pairs of temporary stores or registers, e.g., D flip flops DFF1A,DFF1B; DFF2A,DFF2B; and DFF3A, DFF3B replace individual flip flops. The output V1 from the UBFG2/1 of the control logic circuit UCL2 is connected to provide D inputs to the flip flop pair DFF1A,DFF1B while the outputs W1 from the AND gates of the control logic circuits UCL3A and UCL3B are connected to provide D inputs to the flip flop pairs DFF2A,DFF2B and DFF3A, DFF3B, respectively. The states of the D inputs of the flip flops DFF1B, DFF2B and DFF3B are transferred to their Q outputs by clock signals on the clock line CLOCK when those flip flops are enabled by signals EN applied over the ENABLE line. Similarly, the states of the D inputs of the flip flops DFF1A, DFF2A and DFF3A are transferred to their Q outputs by clock signals on the clock line CLOCK when those flip flops are enabled by signals EN* applied over the ENABLE line.

The Q outputs from both flip flops DFF1A and DFF1B are connected to the output line Q1; the Q outputs from the flip flops DFF2A and DFF2B are connected to the output line Q2; and the Q outputs the flip flops DFF3A and DFF3B are connected to the output line Q3. In this manner, connection of the Q outputs from the flip flops to their associated output multiplexer and to their associated generation cells can be selected either by the EN signals or by the EN* signals.

In relation to FIGS. 21–23, the function cells KC12 . . . KC35 are implemented in the same manner as the function cells KC0 . . . KC3.

It will be appreciated that the control signals M0, M1, etc. for the programmably controlled logic signal generator cells KC0 . . . KC35 can be provided by values stored in memory cells, which may be programmable and individual to each particular function cell.

In FIGS. 18–23 a variety of programmable logic function networks have been shown for connection to receive logic inputs derived from output OR gates OG of a PLD. Individual ones of the various networks shown in the respective FIGS. 18–23 may be selected as required to provide a particular overall logic function in conjunction with the PLD from which the OR gate outputs are derived. Although four logic inputs derived from PLD OR gates OG have been shown by way of example, this is not critical. However, increases in the number of inputs would increase the complexity of the programmable OR circuits POR. Moreover, it is not essential that all of the POR circuits of the UCL networks shown in FIGS. 18–23 receive logic inputs from the same PLD OR gates OG.

Figure 24:
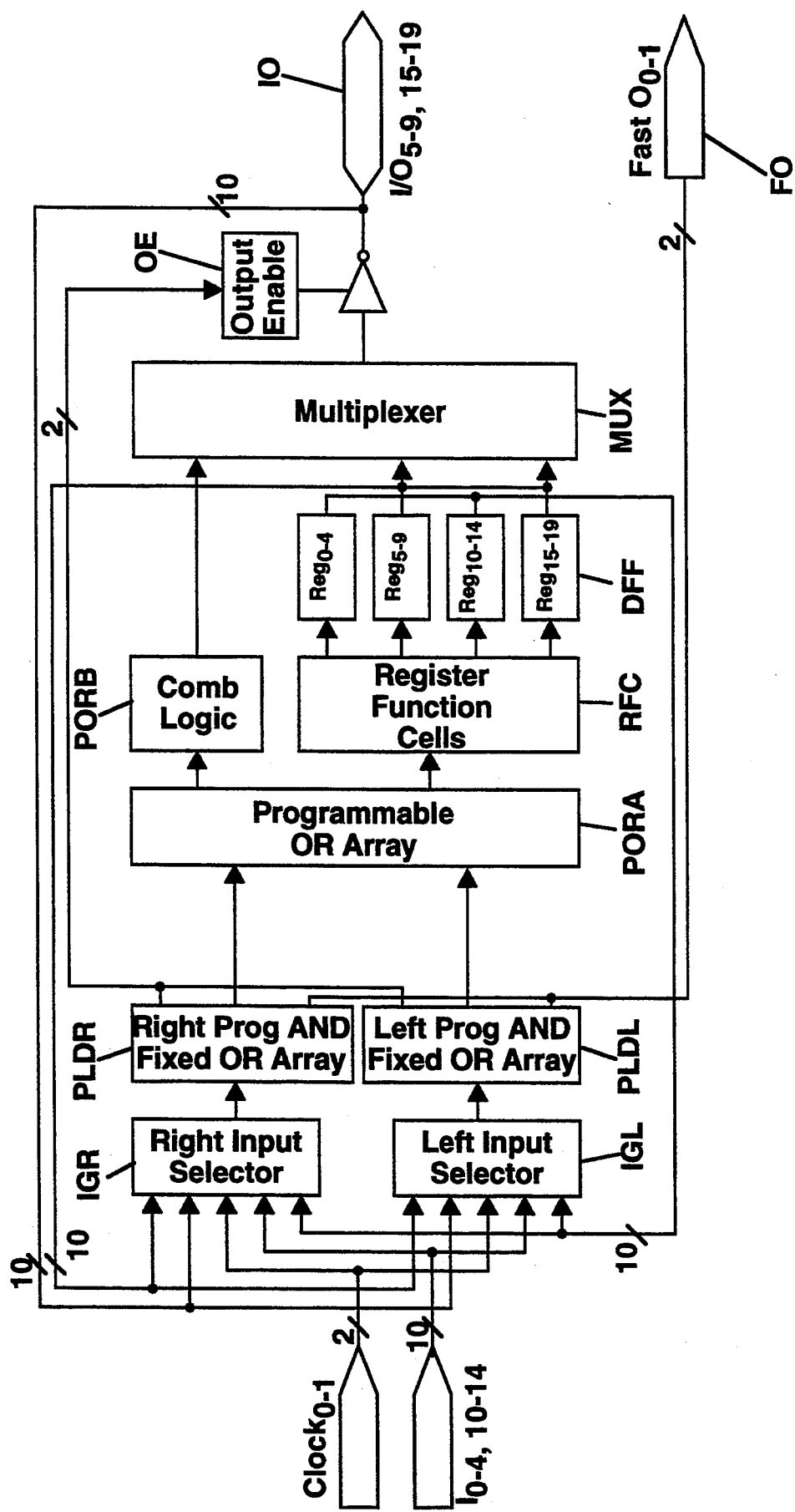
FIG. 24 is a block diagram of a logic system integrated circuit incorporating folded PLDs embodying the invention.

FIG. 24 shows in diagrammatic form, a logic network embodying the folded logic arrays and associated circuit configurations based on those described herein. The network includes two pairs of triangularly folded programmable logic devices PLDL and PLDR which may be based on the configurations described with reference to FIGS. 1–15, comprising a pair of PLDs arranged in a generally rectangular format as depicted by FIG. 16. The outputs from selected OR gates OG of each PLD of the pairs PLDL and PLDR are connected to programmable OR gates POR disposed in an array PORA.

The array PORA together with UBFGs and logic signal generator cells KC located in the Register Function Cells array RFC, flip-flops DFF located in the Register blocks DFFs' additional programmable OR gates located in the Combination Logic array PORB, multiplexers MUX in the Multiplexer block, and output selection circuits located in the Output Function block OE, are interconnected to provide logic functionality associated with circuits such as described with reference to FIGS. 18–23.

Thus, for example, circuits such as UCL2, UCL3A and UCL3B together with the associated UBFGs, function cells KC, flip flops DFF and multiplexers MUX can be realized by appropriate interconnections between the blocks Programmable PORA, RFC, DFF and MUX. Circuits such as UCL1A, UCL1B and UCL1C can be realized by interconnections between the blocks PORB and MUX.

Outputs from the multiplexer in the block MUX are transferred to the output pins I/O by outputs from PLDL and PLDR applied to output enable circuits in the output enable block OE. Outputs from flip flops in the blocks DFF also are connected as feedback logic inputs to the input selections IGL and IGR.

Logic inputs such as $A_xB_x$ and $C_xD_x$ are passed from input/output pins I/O and input pins I and Clocks into input selectors IGL and IGR which select pairs of inputs and perform the functionability of the circuit IG shown in FIG. 3, supplying the resultant minterms to AND gates of the programmable cells PC2 in the arrays PLDL and PLDR. Direct, or fast, outputs from the arrays PLDL and PLDR arrays are obtained by connections from the outputs of OR gates OG of those arrays and output pins FO.

In a particular embodiment of the invention implemented according to the arrangement depicted in FIG. 24, each of the arrays PLDL and PLDR comprises two triangular folded PLD arrays each of which has eighteen PLFGs made up of eight pairs of FAND10, FAND12, FAND14 . . . FAND22 AND gate arrays plus four pairs of FAND24, the OR gates OG of which provide inputs to the programmable OR gate arrays PORA and PORB. An additional pair of PLFGs comprising FAND24 AND gate arrays have OR gates OG, the output from one of which is connected directly to the output pins FO. Outputs from the OR gate OG of the other FAND24 AND gate array in each of the arrays PLDL and PLDR provide output enable and UP/DOWN count control signals.

The overall circuit can be integrated on a semiconductor chip and accommodated in a 28 pin DIP package, and has been designed under the type designation IT 91AL10L.

While particular embodiments of the invention have been described, these embodiments are examples illustrative of the invention and are not to be construed as limiting the invention.

We claim:

1. A programmable logic device including a plurality of groups of AND logic function gates, each AND logic function gate having a plurality of inputs, the AND logic function gates in each group having respective outputs coupled to inputs of a logic OR function output gate associated with that AND logic function gate group;

each of said plurality of said AND logic function gate groups including individual output AND logic function gates having inputs that are programmable by respective programmable logic function generators (PLFG) of a set of PLFGs operatively associated with that output AND logic function gate;

each PLFG having one or more sets of logic input groups and including means for generating from each logic input group, an output logic signal comprising any logic function of that logic input group according to programmable control inputs applied to said first PLFG, each set of PLFGs coupled to supply PLFG outputs to the output AND logic function gate associated with that set of PLFGs;

wherein the PLFGs in any set of PLFGs receive the same sets of logic input groups; and an output stage coupled to generate an output under control of outputs from said logic OR function gates, said output stage including a Boolean function generator (BLFG) comprising:

means for generating an output signal representing any logic function of a plurality of first logic inputs according to second inputs to said BLFG; a plurality of logic cells having outputs coupled to said BLFG to supply said second inputs according to logic inputs to said logic cells; and a plurality of programmable OR logic function generators each having:

an output coupled to supply one of said first logic inputs to said BLFG, a plurality of inputs coupled to respective outputs of a plurality of said logic OR function output gates, and control inputs to receive signals to programmably couple signals from said logic OR function output gates to said logic OR function generator output.

2. A programmable logic device according to claim 1, wherein in each PLFG there are $2^n$ programmable control inputs where n represents the number of logic inputs in each logic input group for that PLFG.

3. A programmable logic device according to claim 1, wherein neighboring ones of said AND logic function gate groups each comprises the same number of individual output AND logic function gates.

4. A programmable logic device according to claim 1, wherein said groups of AND logic function gates are disposed such that said array has a layout approximating a right-triangle with said output logic OR function gates and groups of AND logic function-gates disposed in columns along one side of said triangle.

5. A programmable logic device according to claim 1, wherein each logic input set comprises a logic input pair, and each PLFG includes for each logic input pair for that PLFG, an individual programmable cell connected to receive a first set of logic signals comprising minterms of said logic input pair, and having an output gate connected to receive inputs determined by said first set of logic signals and a second set of user programmable logic inputs to said PLFG.

6. A programmable logic device according to claim 1, wherein the programmable control inputs for each of the PLFGs are provided by values stored in a memory.

7. A programmable logic device according to claim 1, wherein the inputs of each said logic OR function generator are coupled to the same group of logic OR function output gates.

8. A programmable logic device according to claim 1, wherein each said logic cell includes selectable inputs comprising stored values.

9. A programmable logic device according to claim 1, wherein said BLFG output signal is coupled as an input to a store.

10. A programmable logic device according to claim 9, wherein said store is a clocked register stage.

11. A programmable logic device according to claim 10, wherein said clocked register stage has an output coupled to provide an input to said plurality of logic cells.

12. A programmable logic device according to claim 1, wherein said logic cells are coupled to a signal terminal to enable an external input to be coupled to said logic cells.

13. A programmable logic device according to claim 10, including a further programmable logic OR function generator having:

a plurality of inputs coupled to respective outputs of a plurality of said logic OR function output gates, and control inputs to receive signals to programmably couple signals from said logic OR function output gates to an output of said further logic OR function generator; and a logic gate including inputs coupled to receive an output from said BLFG and an output from said further programmable logic OR function generator, said logic gate having an output coupled to an input of said clocked register stage.

14. A programmable logic device including a plurality of groups of AND logic function gates, each AND logic function gate having a plurality of inputs, the AND logic function gates in each group having respective outputs coupled to inputs of a logic OR function gate associated with that AND logic function gate group;

each of a plurality of said groups of AND logic function gates including individual output AND logic function gates having inputs that are programmable by respective programmable logic function generators (PLFG) of a set of PLFGs operatively associated with that group of AND logic function gates;

each PLFG in a said set of PLFGs comprising logic gates coupled to receive the same set of logic input groups, and a group of programmable inputs for each respective logic input group, to generate, for each logic input group, a respective output determined according to said group of programmable inputs as any function of that particular logic input group, said outputs from said PLFGs in said set coupled as inputs to an AND logic function gate in said group of AND logic function gates operatively associated with that set of PLFGs; and circuitry to perform logic operations on outputs from said output logic OR function gates comprising:

a plurality of Boolean function generators (BLFG) each having a plurality of first logic inputs coupled by signal selection circuitry comprising signal selectors having outputs coupled to supply respective ones of said first logic inputs to said BLFGs, each signal selector including a plurality of inputs coupled to outputs of at least some of said output logic OR function gates; each said BLFG comprising:

logic circuitry to generate an output signal representing any function of said plurality of first logic inputs to said BLFG according to second inputs to said BLFG; and a plurality of logic cells having outputs coupled to said BLFG to supply said second inputs according to logic control inputs to said logic cells.

15. A programmable logic device according to claim 14, wherein each said set of logic input groups comprises a set of logic input pairs, and each PLFG includes, for each logic input pair, a programmable cell having AND gates coupled to receive as inputs, respective minterms of said logic input pair, and respective programmable input signals.

16. A programmable logic device according to claim 14, wherein said signal selection circuitry comprises programmable OR logic function generators having outputs coupled to provide the respective first logic inputs to a said BLFG, each said programmable logic OR function generator including:

a plurality of inputs coupled to respective outputs of a plurality of said logic OR function output gates, and control inputs to receive signals to programmably couple signals from said logic OR function output gates to said logic OR function generator output.

17. A programmable logic device according to claim 16 wherein the inputs of each said logic OR function generator are coupled to the same group of logic OR function output gates.

18. A programmable logic device according to claim 14, wherein each said logic cell includes selectable inputs comprising stored values.

19. A programmable logic device according to claim 14, including a plurality of clocked stores coupled to receive output signals from respective ones of at least some of said BLFGs.

20. A programmable logic device according to claim 14, wherein said logic cells are coupled to a signal terminal to enable an external input to be coupled to said logic cells.

21. A programmable logic device according to claim 19, including a further programmable logic OR function generator having:
a plurality of inputs coupled to respective outputs of a plurality of said logic OR function output gates, and control inputs to receive signals to programmably couple signals from said logic OR function output gates to an output of said further logic OR function generator; and
a logic gate coupled to receive as inputs an output from one of said BLFGs and an output from said further programmable logic OR function generator, said logic gate having an output coupled to an input of one of said clocked register stages.

22. A programmable logic device according to claim 14, further including a plurality of clocked stores each coupled to receive a said output signal from an individual BLFG, and to receive a clock signal to transfer an output from said clocked store as inputs to said logic cells coupled to that BLFG.

23. A programmable logic device according to claim 22, wherein at least some of said clocked stores are coupled to transfer an output to the logic cells of at least one other of said BLFGs.

24. A programmable logic device according to claim 22, including a plurality of externally accessible terminals coupled to logic inputs to the logic cells of respective BLFGs.

25. A programmable logic device including a plurality of groups of AND logic function gates each AND logic function gate having a plurality of inputs, the AND logic function gates in each group having respective outputs coupled to inputs of a logic OR function gate associated with that AND logic function gate group;
each of a plurality of said groups of AND logic function gates including individual output AND logic function gates having inputs that are programmable by respective programmable logic function generators (PLFG) of a set of PLFGs operatively associated with that group of AND logic function gates;
each PLFG in a said set of PLFGs comprising logic gates coupled to receive the same set of logic input groups, and a group of programmable inputs for each respective logic input group, to generate, for each logic input group, a respective output determined according to said group of programmable inputs as any function of that particular logic input group, said outputs from said PLFGs in said set coupled as inputs to an AND logic function gate in said group of AND logic function gates operatively associated with that set of PLFGs;
wherein at least some of said AND logic function gate groups comprise different numbers of logic input groups; and
circuitry to perform logic operations controlled by outputs from said output logic OR function gates comprising:
a plurality of Boolean function generators (BLFG) each having a plurality of first logic inputs coupled by programmable logic OR function generators to outputs of at least some of said output logic OR function gates; each said BLFG comprising: logic circuitry to generate an output signal representing any function of said plurality of first logic inputs to said BLFG according to second inputs to said BLFG; and a plurality of logic cells having outputs coupled to said BLFG to supply said second inputs according to logic control inputs to said logic cells; each said programmable logic OR function generator comprising: a plurality of inputs coupled to respective outputs of a plurality of said logic OR function output gates, and control inputs to receive signals to programmably couple signals from said logic OR function output gates to said logic OR function generator output; wherein a plurality of said BLFGs have outputs coupled to inputs of respective clocked stores, said clocked stores coupled to receive clock signals to transfer clocked store outputs as logic inputs to said logic cells of at least one BLFG, and to externally accessible outputs; and wherein the logic inputs to said logic cells also include selectable stored values.

26. A programmable logic device according to claim 25, including at least one further programmable logic OR function generator having:
a plurality of inputs coupled to respective outputs of a plurality of said logic OR function output gates, and control inputs to receive signals to programmably couple signals from said logic OR function output gates to an output of said further logic OR function generator; and
a logic gate coupled to receive as inputs an output from one of said BLFGs and an output from said further programmable logic OR function generator, said logic gate having an output coupled to provide a said input to a said clocked store.

* * * * *